United States Patent
Unou

(10) Patent No.: US 7,816,986 B2
(45) Date of Patent: Oct. 19, 2010

(54) OUTPUT STAGE CIRCUIT

(75) Inventor: Naoki Unou, Gifu (JP)

(73) Assignees: Sanyo Electric Co., Ltd. (JP); Sanyo Semiconductor Co., Ltd. (JP)

( * ) Notice: Subject to any disclaimer, the term of this patent is extended or adjusted under 35 U.S.C. 154(b) by 28 days.

(21) Appl. No.: 12/407,484

(22) Filed: Mar. 19, 2009

(65) Prior Publication Data

US 2009/0237159 A1    Sep. 24, 2009

(30) Foreign Application Priority Data

Mar. 19, 2008   (JP) .............................. 2008-070613

(51) Int. Cl.
*H03F 3/217* (2006.01)
(52) U.S. Cl. .................... 330/251; 330/207 A; 330/10
(58) Field of Classification Search .................. 330/251, 330/207 A, 10
See application file for complete search history.

(56) References Cited

U.S. PATENT DOCUMENTS

| | | | | |
|---|---|---|---|---|
| 5,216,376 A | * | 6/1993 | Swanson | ...................... 330/10 |
| 5,805,020 A | * | 9/1998 | Danz et al. | ...................... 330/10 |
| 6,597,240 B1 | * | 7/2003 | Walburger et al. | ............ 330/10 |
| 7,076,070 B2 | * | 7/2006 | Pearce et al. | ................. 381/120 |
| 7,671,675 B2 | * | 3/2010 | Miyashita et al. | ........... 330/251 |
| 2006/0280314 A1 | | 12/2006 | Okada et al. | |

FOREIGN PATENT DOCUMENTS

JP    2006-333437 A    12/2006

* cited by examiner

*Primary Examiner*—Patricia Nguyen
(74) *Attorney, Agent, or Firm*—Cantor Colburn LLP

(57) ABSTRACT

A PWM signal drives a pair of output transistors connected in series between a supply line and ground so that a push-pull current is output toward a speaker via a coil from a point connecting both output transistors. A current limiting resistor has one end connected to the supply line and between the other end and ground is provided a control transistor. Furthermore, a comparator compares the supply line voltage and a reference voltage and turns on the control transistor when the supply line voltage is higher than the reference voltage in the comparison result thereof.

6 Claims, 2 Drawing Sheets

OUTPUT STAGE CIRCUIT

CROSS-REFERENCE TO RELATED APPLICATION

The disclosure of Japanese Patent Application No. 2008-070613 filed on Mar. 19, 2008, including specification, claims, drawings, and abstract, is incorporated herein by reference in its entirety.

BACKGROUND OF THE INVENTION

1. Field of the Invention

The present invention relates to an output stage circuit of a class D amplifier.

2. Description of the Related Art

Heretofore, in the reproduction of audio signals, systems utilizing a class D amplifier in an output stage thereof are widely available. In such a system, for example, after a digital audio signal undergoes delta sigma (ΔS) modulation, a PWM signal is amplified by a class D amplifier and output to a speaker. In particular, the class D amplifier has good power efficiency and is desirable in portable devices where battery life becomes a problem.

In an output stage of this class D amplifier, output transistors are driven by the PWM signal and a driving current thereof is supplied to a speaker. In particular, in the case of the class D amplifier, since the output transistors are driven by the PWM signal, a coil and a capacitor are inserted between the output transistors and the speaker to smoothen the drive of the speaker.

SUMMARY OF THE INVENTION

Hereupon, the above-mentioned output stage is formed from a pair of transistors, one a current source transistor and one a current sink transistor, which are driven by the PWM signal. Thereupon, the output current becomes a switch between source and sink and a large current variation is generated so that a large counter-electromotive force may be generated by the coil positioned in the stage prior to the speaker. In this case, the voltage of the supply line considerably rises and may possibly reach or exceed the breakdown voltage of the output transistor at the supply side.

The present invention is an output stage circuit of a class D amplifier for driving a pair of output transistors, which are connected in series between a supply line and ground, with PWM signals and outputting a push-pull current toward a speaker via a coil from a point connecting both output transistors and includes a current limiting resistor having one end connected to the supply line, a control transistor connected between the other end of the current limiting resistor and ground, and a comparator for comparing the supply line voltage and a reference voltage and turning on the control transistor when the supply line voltage is higher than the reference voltage in the comparison result thereof.

DETAILED DESCRIPTION OF THE PREFERRED EMBODIMENTS

Embodiments of the present invention will be described hereinafter with reference to the attached drawings.

Figure 1:
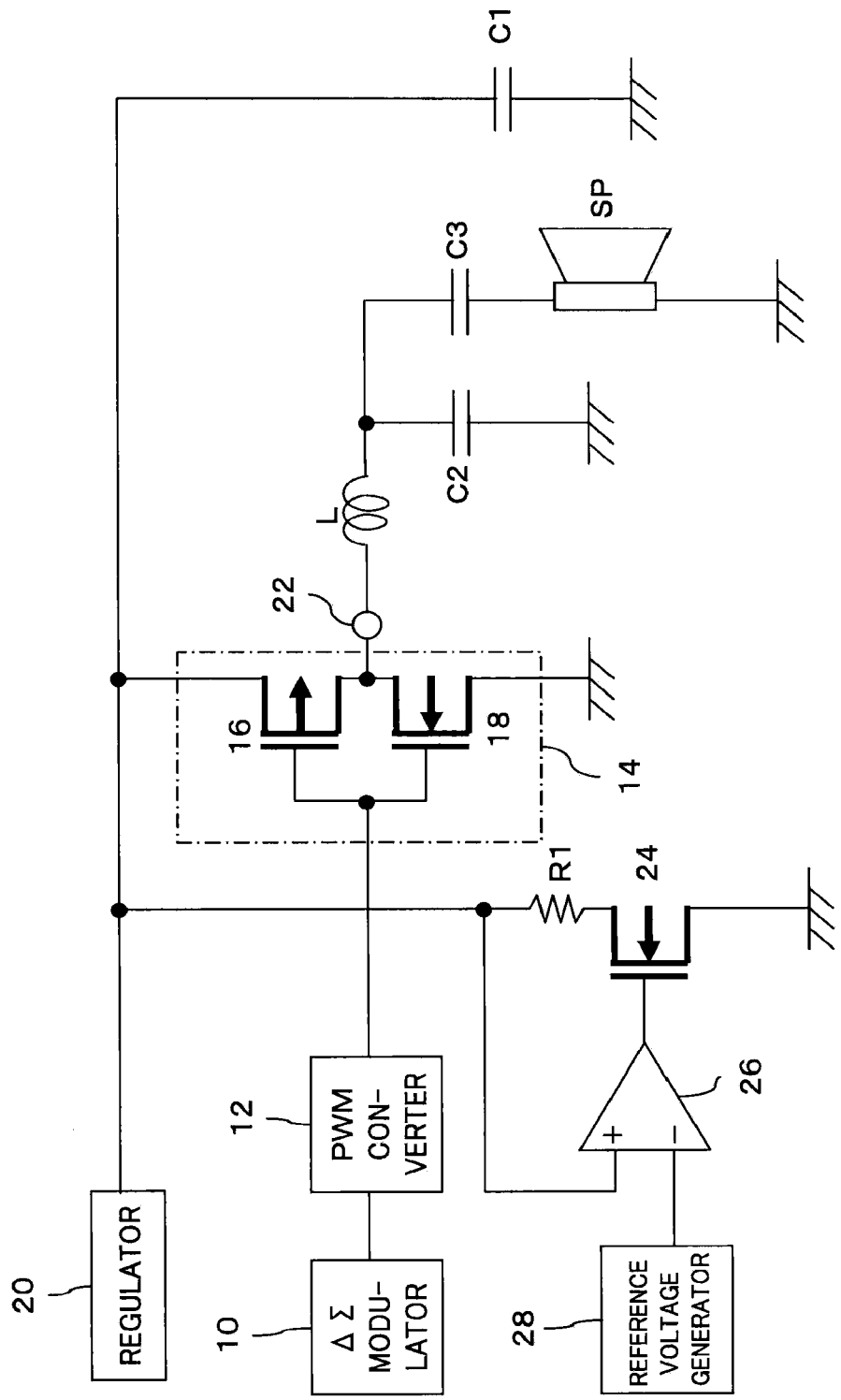
FIG. 1 is a block diagram showing a configuration of an embodiment.

FIG. 1 is a block diagram showing a configuration of an embodiment, which illustrates an output stage circuit of a class D amplifier.

An audio signal is converted into a one-bit bit stream at a ΔΣ modulator 10 then supplied to a PWM converter 12. The PWM converter 12 converts the supplied bit stream at a duty ratio in accordance with a state of 1's and 0's thereof into a PWM signal at a PWM carrier frequency. The PWM signal is then supplied to a class D amplifier 14.

The class D amplifier 14 includes a pair of output transistors 16 and 18. Namely, a source of the output transistor 16 at the source side formed from a P-type MOS transistor is connected to a supply line VDD, a drain is connected to a drain of the output transistor 18 at the sink side formed from an N-type MOS transistor, and a source of the output transistor 18 is connected to ground. To gates of the output transistors 16 and 18 are supplied a PWM signal from the PWM converter 12. It should be noted the figure of class D amplifier 14 only shows a basic configuration of the output transistors 16 and 18.

The supply line VDD is connected to a supply input terminal for inputting supply voltage VDD of an externally connected regulator 20.

A point connecting the output transistors 16 and 18 is connected to an output terminal 22 to which is connected one end of a coil L. The other end of the coil L is connected to ground via a capacitor C2 as well as to one end of a speaker SP via a capacitor C3. The other end of the speaker SP is connected to ground. Furthermore, the supply line VDD is connected to ground through an externally connected capacitor C1.

To the supply line VDD is connected one end of a current limiting resistor R1. The other end of the current limiting resistor R1 is connected to a drain of a control transistor 24 formed from an N-type MOS transistor and a source of the control transistor 24 is connected to ground. Furthermore, the supply line VDD is connected to a positive input terminal of a comparator 26 and a reference voltage Vref from a reference voltage generator 28 is connected to a negative input terminal of the comparator 26. An output terminal of the comparator 26 is connected to a gate of the control transistor 24.

In this circuit, the supply voltage VDD is supplied from the regulator 20 to the supply line VDD. Then, the supply line VDD is connected to the capacitor C1 so that the supply voltage VDD stabilizes. From the PWM converter 12 is output a PWM signal in accordance with the audio signal and one of the output transistors 16 or 18 turns on due to this PWM signal. Namely, the output transistor 18 turns on at an H level of the PWM signal and the output transistor 16 turns on at an L level. As the output transistor 16 turns on, current from the output transistor 16 flows through the coil L toward the speaker SP side, and as the output transistor 18 turns on, current from the speaker SP side flows through the coil L to the output transistor 18. The current is then supplied to the speaker SP via the capacitor C3 to drive the speaker SP. A high frequency component is removed by the coil L and the capacitor C2.

The current flows through the coil L in an opposite direction depending on whether the output transistor 16 or 18 turns on. Therefore, a counter-electromotive force is generated in accordance with the change in current. If the change in the amount of current is large, the counter-electromotive force becomes large. For example, if the supply voltage VDD is 1.5 V, the breakdown voltage of the output transistor 16 is often set to approximately 1.65 V. The supply voltage VDD may exceed the breakdown voltage of the output transistor 16 due to the counter-electromotive force although this depends on the value of the externally connected capacitor C1.

In the embodiment, the reference voltage Vref generated in the reference voltage generator 28 has been set to the breakdown voltage of the output transistor 16, for example, 1.65 V. When the supply voltage VDD exceeds the reference voltage Vref, the control transistor 24 turns on. As a result, current flows from the supply line VDD to ground via the current limiting resistor R1 and the control transistor 24 and the supply voltage VDD of the supply line VDD can be prevented from reaching and exceeding the reference voltage Vref.

In this manner, according to the embodiment, turning on the control transistor from the comparator can effectively prevent the supply line voltage from rising.

When the supply voltage VDD is 1.5 V and the reference voltage Vref is 1.65 V, a resistance of approximately 1 kΩ is selected for the current limiting resistor R1 and a capacitance of 100 μF is selected for the capacitor C1. Furthermore, the configuration in the figure shows the regulator 20, the coil L, the capacitors C1, C2, and C3 connected externally with respect to the IC. Approximately 3.3 V is employed as the circuit operating supply within the IC and it is preferable to configure the reference voltage generator 28 with, for example, a band-gap constant voltage circuit for receiving the 3.3 V supply.

According to the embodiment, the capacitor C1 can generally have a relatively small capacitance and it is not necessary to turn down the volume so that an insufficient breakdown voltage of the output transistor 16 can be prevented.

Figure 2:
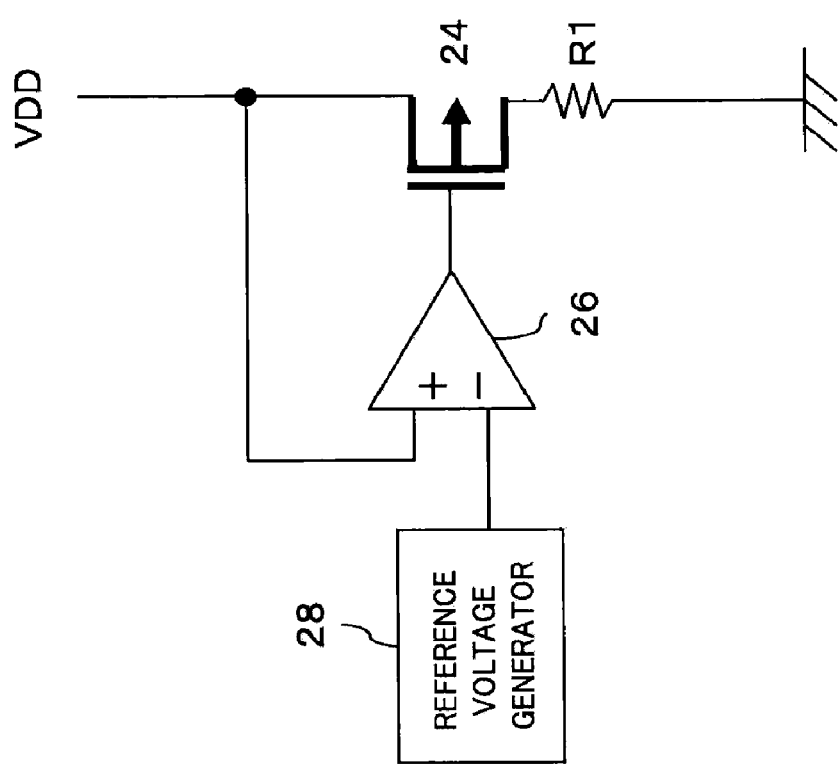
FIG. 2 is a block diagram showing a configuration of another embodiment.

FIG. 2 shows an example of another configuration. In this example, the control transistor 24 is a P type transistor, a source thereof is connected to the supply line VDD and a drain is connected to ground via the current limiting resistor R1. The comparator 26 then compares the supply line voltage (voltage of VDD, which is the output of the regulator 20) and the reference voltage from the reference voltage generator 28. As a result of the comparison, if the supply line voltage is higher than the reference voltage, the control transistor 24 turns on. This configuration also yields the same effect as in the above-mentioned configuration.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An output stage circuit of a class D amplifier, comprising:
   a pair of output transistors driven by a PWM signal and connected in series between a supply line and ground for outputting a push-pull current toward a speaker via a coil from a point connecting both output transistors;
   a current limiting resistor having one end connected to said supply line;
   a control transistor connected between the other end of the current limiting resistor and ground; and
   a comparator for comparing voltage of said supply line and a reference voltage and turning on said control transistor when the voltage of said supply line is higher than the reference voltage in the comparison result thereof.

2. An output stage circuit according to claim 1, wherein: said control transistor is an N type transistor.

3. An output stage circuit according to claim 1, wherein: said supply line is connected to a regulator for generating a predetermined supply voltage.

4. An output stage circuit of a class D amplifier, comprising:
   a pair of output transistors driven by a PWM signal and connected in series between a supply line and ground for outputting a push-pull current toward a speaker via a coil from a point connecting both output transistors;
   a current limiting resistor having one end connected to said ground;
   a control transistor connected between the other end of the current limiting resistor and the supply line; and
   a comparator for comparing voltage of said supply line and a reference voltage and turning on said control transistor when the voltage of said supply line is higher than the reference voltage in the comparison result thereof.

5. An output stage circuit according to claim 4, wherein: said control transistor is a P type transistor.

6. An output stage circuit according to claim 5, wherein: said supply line is connected to a regulator for generating a predetermined supply voltage.

* * * * *